US009472787B2

(12) United States Patent
Rickers et al.

(10) Patent No.: US 9,472,787 B2
(45) Date of Patent: Oct. 18, 2016

(54) FABRICATION APPARATUS FOR FABRICATING A PATTERNED LAYER

(75) Inventors: Christoph Rickers, Aachen (DE); Pieter Gijsbertus Maria Kruijt, Eindhoven (NL)

(73) Assignee: OLEDWorks GmbH, Aachen (DE)

( * ) Notice: Subject to any disclaimer, the term of this patent is extended or adjusted under 35 U.S.C. 154(b) by 0 days.

(21) Appl. No.: 14/117,436

(22) PCT Filed: May 9, 2012

(86) PCT No.: PCT/IB2012/052292
§ 371 (c)(1),
(2), (4) Date: Nov. 13, 2013

(87) PCT Pub. No.: WO2012/160468
PCT Pub. Date: Nov. 29, 2012

(65) Prior Publication Data
US 2014/0203250 A1    Jul. 24, 2014

(30) Foreign Application Priority Data

May 23, 2011    (EP) .................................... 11167070

(51) Int. Cl.
| H01L 21/02 | (2006.01) |
| H01L 51/56 | (2006.01) |
| H01L 51/00 | (2006.01) |
| H01L 51/50 | (2006.01) |

(52) U.S. Cl.
CPC .......... *H01L 51/56* (2013.01); *H01L 21/02104* (2013.01); *H01L 51/0023* (2013.01); *H01L 51/50* (2013.01)

(58) Field of Classification Search
CPC ....... H01L 51/0037; H01L 51/0022–51/0023; H01L 51/56; H01L 51/0017; H05K 2203/013; H05K 3/125; B22F 9/24; B23K 26/365
USPC .............................. 438/99, 149, 597; 257/40
See application file for complete search history.

(56) References Cited

U.S. PATENT DOCUMENTS

| 6,964,592 B2 * | 11/2005 | Kim ................................ 445/24 |
| 7,669,988 B2 | 3/2010 | Sharma et al. |
| 8,659,220 B2 * | 2/2014 | Sakaguchi .................... 313/505 |
| 2006/0189113 A1 | 8/2006 | Vanheusden et al. |
| 2007/0259474 A1 | 11/2007 | Shin et al. |
| 2010/0034986 A1 | 2/2010 | Kodas et al. |

FOREIGN PATENT DOCUMENTS

| DE | 102007043182 A1 | 3/2009 |
| EP | 2086033 A1 | 8/2009 |
| JP | 2009-500788 A | 1/2009 |
| WO | 2006121297 A1 | 11/2006 |

* cited by examiner

*Primary Examiner* — Dung Le
(74) *Attorney, Agent, or Firm* — Stephen P. Singer

(57) ABSTRACT

The invention relates to a fabrication apparatus for fabricating a patterned layer (18) on a substrate (14). Protective material (17) is applied in second regions on the substrate (14) and liquid layer material (18) is then printed in first regions being different to the second regions on the substrate (14). The layer material (18) is dried by heating the layer material (18) to a drying temperature being smaller than a melting temperature of the protective material (17), before removing the protective material (17) from the substrate (14) by using a removing temperature being larger than the melting temperature of the protective material (17). A patterned layer (18) can therefore be produced, without using, for example, a costly photolithography process, and because of the use of the protective material (17) the layer material (18) is present in the desired first regions only and not in the second regions. This improves the quality of the patterned layer, which may be used for producing an OLED.

7 Claims, 5 Drawing Sheets

FABRICATION APPARATUS FOR FABRICATING A PATTERNED LAYER

FIELD OF THE INVENTION

The invention relates to a fabrication apparatus, a fabrication method and a fabrication computer program for fabricating a patterned layer. The invention relates further to an electrical device like an organic light-emitting diode (OLED) comprising the patterned layer.

BACKGROUND OF THE INVENTION

An OLED comprises generally a patterned conductive material for providing an anode, wherein organic layers are sandwiched between the anode and a further conductive layer forming a cathode. The conductive layer forming the anode is generally patterned by using photolithography. This makes the patterned layer, especially for small product series, an expensive component, because photolithography has been developed for very high accuracy and fine pattern resolution which makes it an expensive process.

SUMMARY OF THE INVENTION

It is an object of the present invention to provide a fabrication apparatus, a fabrication method and a fabrication computer program for fabricating a patterned layer, without using the costly photolithography process. It is a further object of the present invention to provide an electrical device like an OLED comprising the fabricated patterned layer.

In a first aspect of the present invention a fabrication apparatus for fabricating a patterned layer on a substrate is presented, wherein the substrate comprises first regions, in which layer material forming the layer is to be applied, and second regions, in which the layer material is not to be applied, wherein the fabrication apparatus comprises:
- a protective material application unit for applying protective material in the second regions on the substrate,
- a layer material application unit for printing liquid layer material in the first regions on the substrate,
- a drying unit for drying the layer material by heating the layer material to a drying temperature being smaller than a melting temperature of the protective material,
- a protective material removing unit for removing the protective material from the substrate by using a removing temperature being larger than the melting temperature of the protective material.

Since the layer material is printed in the first regions on the substrate, a patterned layer can be produced, without using the costly photolithography process. Moreover, since the protective material is applied in the second regions on the substrate, before printing the liquid layer material in the first regions on the substrate, in the second region the layer material can only be located on the protective material. Thus, after the protective material has been removed, the layer material is present in the first regions only and not in the second regions. This improves the quality of the patterned layer.

The patterned layer can be located directly on the substrate or one or several other layers can be arranged between the substrate and the patterned layer. For example, the substrate can be a glass plate coated with a barrier layer, which may comprise silicon oxide or silicon nitride, and coated with a conductive coating like an indium tin oxide (ITO) coating. The conductive coating is preferably transparent. The fabrication apparatus can therefore be adapted to apply the protective material and print the layer material on the conductive layer already provided on the substrate.

The substrate with the optional one or several coatings can be cleaned before applying the protective material and printing the layer material. The substrate with the optional one or several coatings can also be pre-treated such that the printing accuracy and wetting behavior is improved, in order to reduce, in particular, prevent, a generally possible extensive spreading of the protective material and/or the layer material.

In a preferred embodiment, the protective material application unit is adapted to apply the protective material by printing. Printing has the advantage of being less costly in comparison to photolithography and can provide fast switching times from one design to another. It is further preferred that the protective material application unit is adapted to apply wax as the protective material. In an embodiment, a wax is used which becomes liquid at about 90° C. The wax is preferentially a printable hot wax ink.

It is also preferred that layer material application unit is adapted to apply metal as the layer material. The layer material comprises preferentially silver or copper. For example, the layer material application unit can be adapted to use ink jet printing or screen printing for applying the layer material. Preferentially, the layer material application unit is adapted to print metal ink in the first regions on the substrate.

The substrate is preferentially coated with a conductive layer, wherein the fabrication apparatus can further comprise an ablation unit for ablating the conductive layer through at least one of the protective material and the applied layer material for generating a patterned conductive layer on the substrate. In particular, the ablation unit comprises a laser for performing laser ablation through the protective material and/or the layer material. In an embodiment, the laser is a solid state laser operating at 355 nm having a Q-switch mode for equal pulse energy. The beam profile can be Gauss-shaped. However, in a preferred embodiment, the beam profile is a flat top profile. Also laser ablation is less costly than photolithography and can provide fast switching times from one design to another.

The ablation of the conductive layer is preferentially performed after the layer material has been applied, in particular, after metal ink has been printed on the substrate, i.e. on the conductive layer of the substrate, and dried. The ablation unit is preferentially adapted to ablate an ITO layer on the substrate as the conductive layer.

It is further preferred that the protective material removing unit is adapted to use heated water for removing the protective material. Thus, the protective material can be removed in a relatively simple way by just using heated water. Preferentially, the protective material, which is preferentially wax, is removed by using water which is heated to a temperature being larger than the melting temperature of the wax. The water is preferentially distilled water. For example, the water is heated to a temperature of about 90° C., at which temperature the wax may be liquid, or to a larger temperature. It can be provided as liquid at a temperature below, for example, 100° C., as steam at a temperature of, for example, about 100° C., or as superheated steam at a temperature larger than, for example, 100° C. The removing procedure can be performed by spray-stripping or another stripping technique.

The protective material removing unit can further be adapted to heat the layer structure, in particular, the substrate to a temperature, at which the protective material evaporates. The evaporation may remove monolayers of the protective material, which may still be present after a removing procedure has been performed by using heated water only.

In a preferred embodiment the fabrication apparatus further comprises a sintering unit for sintering the layer material. The layer material is preferentially metal ink like silver or copper ink, which is sintered by, for example, a temperature being larger than 130° C. By sintering also possible remaining parts of wax can be removed by vaporizing them.

It is also preferred that the fabrication apparatus comprises an insulating material application unit for applying insulating material on the layer material, after the protective material has been removed. The insulating material application unit is preferentially adapted to apply the insulating material by inkjet printing. The insulating material is preferentially a resist.

The fabrication apparatus can further comprise a curing unit for curing the insulating material. In an embodiment, the curing unit is adapted to bake the insulating material.

In an embodiment, the fabrication apparatus comprises an electrical device producing unit for producing an electrical device comprising the patterned layer. For example, the substrate can comprise one or several coatings, in particular, a conductive coating like an ITO coating, and the layer material can be printed on the conductive coating. The conductive coating can be patterned by using the ablation unit such that a layer structure is produced, which comprises a substrate with a patterned conductive coating, which is, for example, a patterned ITO coating, and with the printed layer material which preferentially forms a second patterned conductive coating. The electrical device producing unit can be adapted to apply organic material on the layer structure, and then on a part of the layer structure and on the organic material a further conductive layer for providing a cathode. The patterned conductive coating on the substrate, i.e., for example, the patterned ITO coating can form the anode, wherein the patterned printed layer material can be regarded as being a supportive structure for improving the current distribution within the anode. The cathode and the anode can be electrically connected to a voltage source, in order to apply voltage to the organic material, which then emits light. The produced electrical device is therefore preferably an OLED. The electrical device producing unit can further be adapted to provide a casing and a getter for protecting the organic material against moisture.

In a further aspect of the present invention an electrical device is presented, wherein the electrical device comprises a patterned layer on a substrate fabricatable by the fabrication apparatus as defined in claim 1. In a preferred embodiment, the electrical device is an OLED.

In a further aspect of the present invention a fabrication method for fabricating a patterned layer on a substrate is presented, wherein the substrate comprises first regions, in which layer material forming the layer is to be applied, and second regions, in which the layer material is not to be applied, wherein the fabrication method comprises:
applying protective material in the second regions on the substrate,
printing liquid layer material in the first regions on the substrate,
drying the layer material by heating the layer material to a drying temperature being smaller than a melting temperature of the protective material,
removing the protective material from the substrate by using a removing temperature being larger than the melting temperature of the protective material.

In a further aspect of the present invention a fabrication computer program for fabricating a layer structure is presented, wherein the fabrication computer program comprises at least a first patterned layer and a second patterned layer on a substrate, the computer program comprising program code means for causing a fabrication apparatus as defined in claim 1 to carry out the steps of the fabrication method as defined in claim 12, when the computer program is run on a computer controlling the fabrication apparatus.

It shall be understood that the fabrication apparatus of claim 1, the electrical device of claim 10, the fabrication method of claim 12 and the fabrication computer program of claim 13 have similar and/or identical preferred embodiments as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

Figure 1:
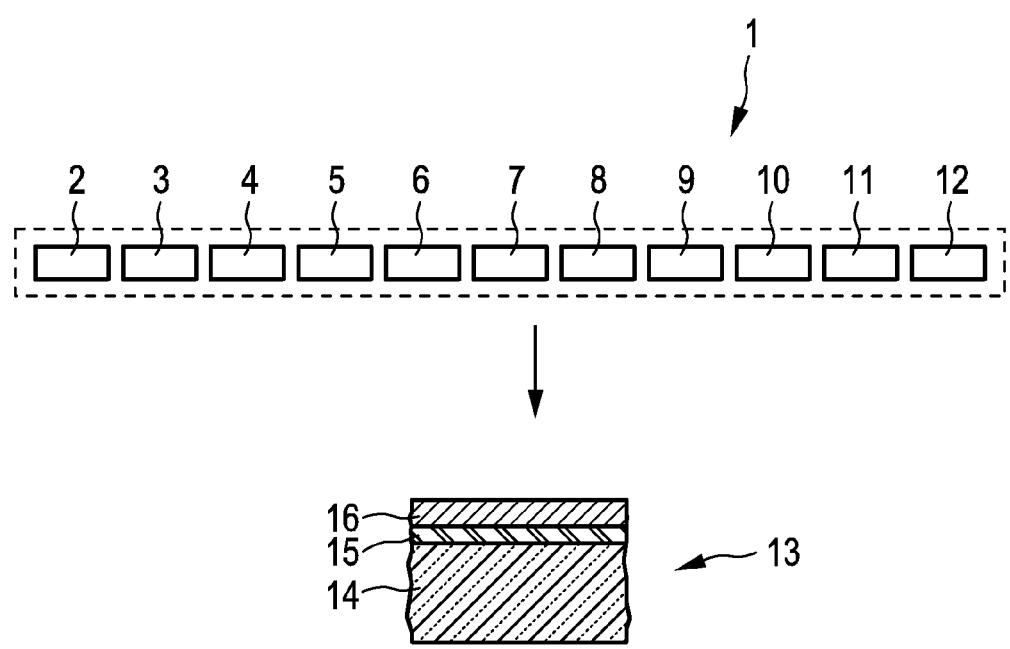
FIG. 1 shows schematically and exemplarily an embodiment of a fabrication apparatus for fabrication a patterned layer from a substrate.

FIG. 1 shows schematically and exemplarily a fabrication apparatus for fabricating a patterned layer on a substrate, wherein the substrate comprises first regions, in which layer material forming the layer is to be applied, and second regions, in which the layer material is not to be applied. In this embodiment, the substrate 14 is coated with a barrier layer 15 and a conductive layer 16. The barrier layer 15 is preferentially a silicon oxide layer or a silicon nitride layer. The barrier layer 15 may have a thickness in the range of 10 to 30 nm. The conductive layer 16 is, in this embodiment, an ITO layer, and may have a thickness of 150 nm. The substrate 14, the barrier layer 15 and the conductive layer 16 form a layer structure 13, which is processed by the fabrication apparatus 1.

The fabrication apparatus 1 comprises an initial cleaning unit 2 for initially cleaning the layer structure 13. For example, firstly the wetting behavior of the water can optionally be improved, then several rinsing steps and/or mechanically brushing may follow. After those steps which normally remove the bigger particles, ultrasonic and megasonic cleaning steps can follow for removing smaller particles before the layer structure 13 is then moved underneath an air-knife and subsequently dried by infrared heating. After this process an ultraviolet ozone preparation step can follow for altering the surface energy.

Figure 2:
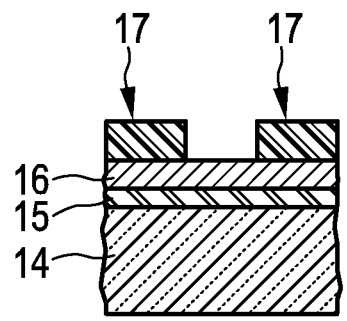
FIGS. 2 to 6 show schematically and exemplarily layer structures after different processing steps performed by the fabrication apparatus.

The fabrication apparatus 1 further comprises a protective material application unit 3 for applying protective material 17 in the second regions on the substrate, i.e. on the conductive layer 16, which is coated together with the barrier layer 15 on the substrate 14. In this embodiment, the protective material application unit 3 is adapted to apply the protective material 17 by printing. The protective material is preferentially wax ink, which can also be denoted as hot wax ink. The used wax becomes liquid at about 90° C. After printing and loosing temperature the protective material solidifies and forms a protective mask. The protective material application unit 3 is preferentially adapted to use heated inkjet technology provided, for example, by the company Océ Technologies B.V. FIG. 2 shows schematically and exemplarily a resulting layer structure with the protective material 17.

Figure 3:
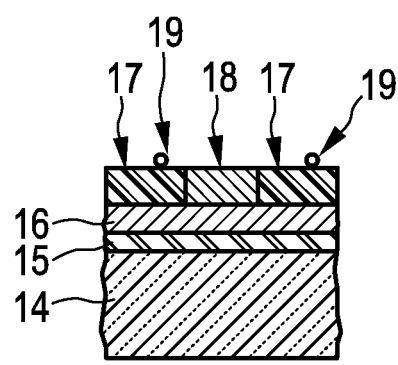

The fabrication apparatus 1 further comprises a layer material application unit 4 for printing liquid layer material in the first regions on the substrate, i.e., in this embodiment, for printing liquid layer material in the first regions on the substrate 14 comprising the barrier layer 15 and the conductive layer 16. In this embodiment, the layer material application unit 4 is adapted to apply metal ink like silver or copper ink as the layer material by using inkjet printing or screen printing. The metal ink can comprise metal nanoparticles and an amount of polymers for preventing the metal ink to clog inside the print head. The polymers can be driven out later by a sintering process described below, in which only the metal remains and the individual nanoparticles melt together. For example, silver nanoparticle based ink from, for instance, SunChemicals with the product name "Suntronic U5603" consisting of 25 to 40 volume percent ethanediol, 25 to 40 volume percent ethanol, 10 to 25 volume percent glycerin, 2.5 to 5 volume percent 2-isopropoxyethanol and about 3 volume percent Ag can be used together with the metal ink inkjet technology provided by a Dimatix DMP2800 with standard Dimatix Material Cartridges DMC11610. FIG. 3 shows schematically and exemplarily the layer structure after the layer material 18 being, in this embodiment, metal ink has been printed.

After the layer material 18 has been printed, a drying unit 5 dries the layer material 18 by heating the layer material 18 to a drying temperature being smaller than a melting temperature of the protective material 17. For example, the drying unit 5 can be adapted to dry the layer material 18 at a temperature of about 80° C. for, for example, 15 min. The drying unit 5 can comprise a convection oven for performing the drying procedure.

Figure 4:
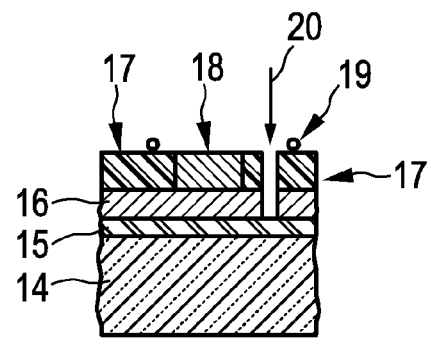

The fabrication apparatus 1 further comprises an ablation unit 6 for ablating the conductive layer 16 through the protective material 17 and/or through the applied layer material 18 for generating a patterned conductive layer 16. In this embodiment, the ablation unit 6 comprises a laser for performing laser ablation through the protective material and/or the layer material. The laser is preferentially a solid-state laser operating at 355 nm having a Q-switch mode for equal pulse energy. The beam profile can be Gauss-shaped, but can also have another shape like a flat top profile shape. The resulting layer structure is schematically and exemplarily shown in FIG. 4. In FIG. 4, the arrow 20 indicates the laser of the ablation unit 6.

The laser ablation can create debris particles of the protective material 17 and/or the layer material 18 being preferentially metal ink. Moreover, the laser ablation can create debris of the layer material 16. In FIG. 4, a debris particle is denoted by reference number 19. The laser ablation is performed after the layer material 18 has been printed on the layer structure, in order to avoid accidentally printed layer material, i.e., in this embodiment, accidentally printed metal, on top of the ablation lines. Ablation after printing the layer material 18 ensures that ablation lines will not be covered by debris particles, and ablation after printing the protective material 17 ensures that the debris from ablation does not remain on the layer 16 after removal of the protective material 17.

Figure 5:
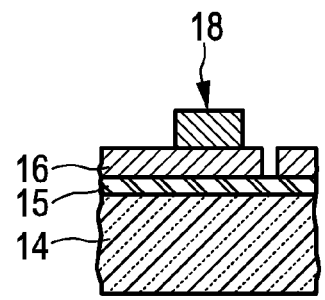

The fabrication apparatus 1 further comprises a protective material removing unit 7 for removing the protective material 17 from the substrate by using a removing temperature being larger than the melting temperature of the protective material 17. In this embodiment, the protective material removing unit 7 is adapted to use heated water for removing the protective material 17. In particular, wax is preferentially used as the protective material, which is removed by using water being heated to a temperature, which is larger than the melting temperature of the wax. In particular, the water is preferentially distilled water, which is heated to a temperature of about 90° C. or 95° C. The removing procedure is preferentially performed by spray-stripping. However, in another embodiment the removing procedure can also be performed by using another stripping technique. For example, the protective material removing unit 7 can comprise a cascade of rinsing stations, wherein from rinsing station to rinsing station the protective material is removed more and more. With removing the protective material 17 also debris particles, which may have been created by the ablation procedure, and/or metal ink, i.e. layer material, which has mistakenly printed in the second regions, are removed. FIG. 5 shows schematically and exemplarily the layer structure, after the protective material 17 has been removed.

The fabrication apparatus further comprises a sintering unit 8 for sintering the layer material 18. The sintering unit 8 is preferentially adapted to sinter the metal ink at a temperature being larger than 130° C. This sintering step can have the side effect that it can further remove potential thin remainders of the protection material 17. The sintering can therefore be performed such that remainders of the protective material can be removed.

Figure 6:
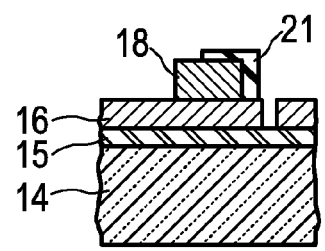

The fabrication apparatus 1 further comprises an insulating material application unit 9 for applying insulating material on the layer material. In this embodiment, the insulating material 21 is a resist, which is applied by inkjet printing. The resist is, for example, a photo-resist like AZ1518, wherein preferentially the above described inkjet technology using an Dimatix DMP2800 with standard Dimatix Material Cartridges DMC11610 can be used. The resulting layer structure with the insulating material 21 is schematically and exemplarily shown in FIG. 6.

The fabrication apparatus 1 further comprises a curing unit 10 for curing the insulating material, in particular, to bake the insulating material. Moreover, the fabrication apparatus 1 comprises a final cleaning unit 11 for performing a final cleaning procedure. The final cleaning unit 11 can be adapted to perform a final cleaning which is similar to the initial cleaning described above. The initial cleaning and the final cleaning can be performed by the same or different units.

Figure 7:
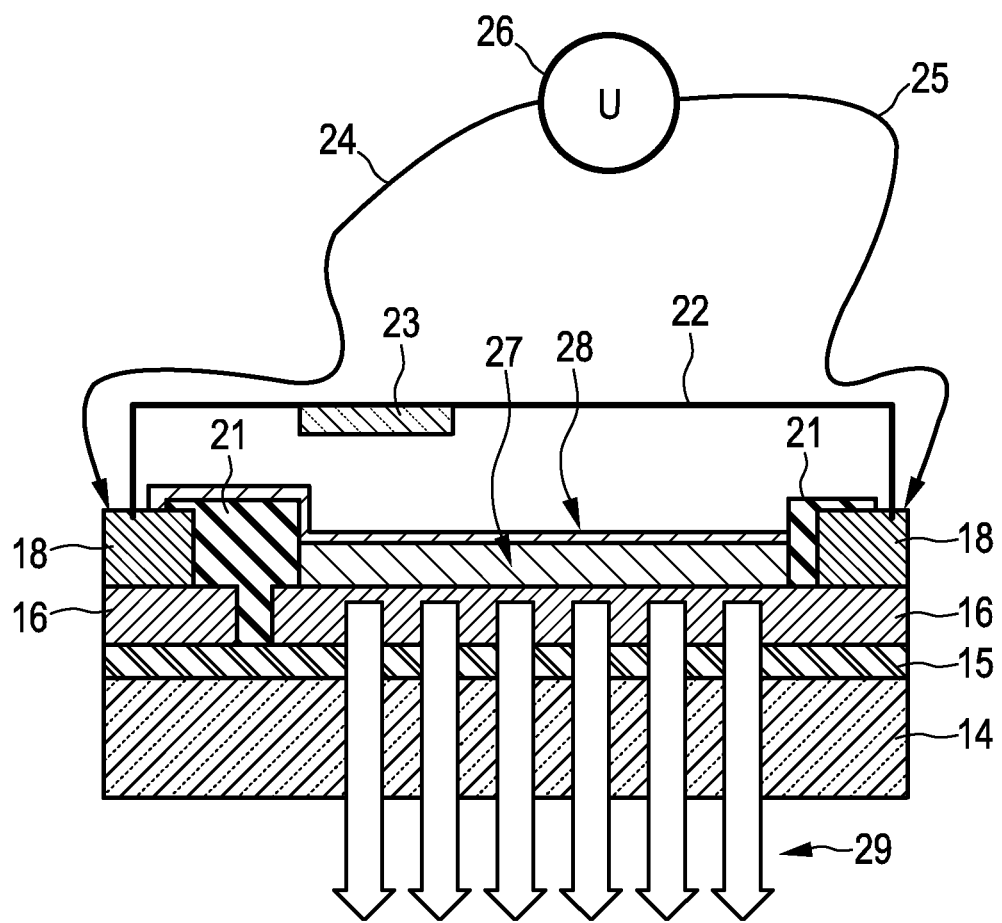
FIG. 7 shows schematically and exemplarily an OLED comprising the processed layer structure.

The fabrication apparatus 1 can further comprises an electrical device producing unit 12 for producing an electrical device comprising the cleaned layer structure. For example, the electrical device producing unit 12 can be adapted to apply an organic layer 27 and a further conductive layer 28 on the layer structure as schematically and exemplarily shown in FIG. 7. Moreover, the electrical device producing unit 41 can be adapted to attach a metal casing 22 with a getter 23 for moisture protection on the layer structure. The further conductive layer 28 and the part of the ablated conductive pattern 16, which is adjacent to the organic layer 27, are then connected to the voltage source 26 via electrical connections 24, 25, in order to induce electrical currents in the organic material 27 for generating light 29 in a known way. The further conductive layer 28 is therefore preferentially a cathode and the part of the ablated conductive layer 16, which is adjacent to the organic material 27, is preferentially an anode. The electrical device produced by the electrical device producing unit 12 is therefore preferentially an OLED.

Figure 8:
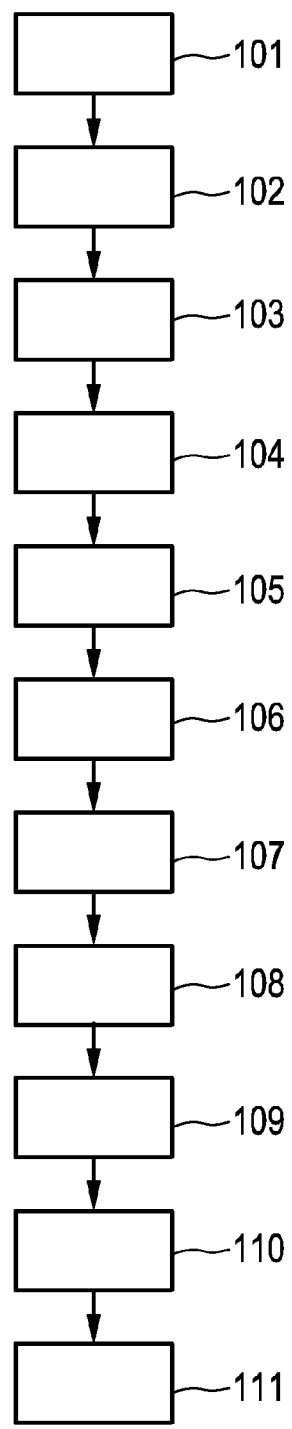
FIG. 8 shows a flowchart exemplarily illustrating an embodiment of a fabrication method for fabricating a patterned layer on a substrate

In the following an embodiment of a fabrication method for fabricating a patterned layer on a substrate will exemplarily be described with reference to a flowchart shown in FIG. 8.

In step 101, the initial cleaning unit 2 cleans the substrate 14 with the barrier layer 15 and the conductive layer 16. In step 102, the protective material application unit 3 applies protective material in second regions, in which layer material is not to be applied. In particular, the protective material application unit 5 prints wax in the second regions on the conductive layer 16 for protecting these second regions. In step 103, the layer material application unit 4 prints metal ink as layer material in first regions, in which metal should finally be present, on the substrate, i.e. on the conductive layer 16 coated on the barrier layer 15 on the substrate 14. In step 104, the drying unit 5 dries the metal ink by heating the metal ink to a drying temperature being smaller than a melting temperature of the protective material, and, in step 105, the ablation unit 6 ablates the conductive layer 16 through at least one of the protective material 17 and the applied metal 18 for generating a patterned conductive layer 16. In step 106, the protective material removing unit removes the protective material 17 by using heated water, which is heated to, for example, a temperature of about 90° C. or 95° C. at which temperature the protective material, which is preferentially wax, becomes liquid. In step 107, the sintering unit 8 sinters the metal material 18, and, in step 108, the insulating material 21 is applied by using the insulating material application unit 9. The applied insulating material is then cured, in particular, baked, by a curing unit 10 in step 109, whereupon the resulting layer structure is cleaned by the final cleaning unit 11 in step 110. In step 111, the electrical device producing unit 12 produces an electrical device, in particular, an OLED, based on the cleaned layer structure.

Substrates for OLED fabrication are generally widely made from display glass with a transparent conductive anode coating and a metallization on top. Both anode and metal layer are patterned to realize electrically insulating regions and in case of the metal to create a window for the light extraction. While in OLED displays or small devices the metal is usually only forming a frame of the device in larger devices, due to the limited conductivity of the anode material, additional supporting fine metal structures can be applied to improve lateral current distribution to realize homogeneously emitting devices. Alternative substrates can also be made of another material like a plastics material.

The current fabrication mostly is based on full area coatings of anode and metallization as well with a subsequent patterning process which is usually done by photolithography. This makes substrates, especially for small product series, an expensive component since a lot of metal material is waist; photolithography is expensive due to mask costs and with limited environmental friendliness due to the needed chemistry.

Instead of photolithography, the fabrication apparatus and method use a printing process for printing the layer material, in particular, the metal ink. Generally, there is a reasonable risk of putting the layer material into an unwanted area. By screen printing this may be ink creeping underneath the mesh after some time; so subsequently the ink can get in contact with the above mentioned anode forming uncontrolled islands of the layer material. Looking at inkjet printing this artificial and unwanted deposition of the layer material can be attributed to nozzle clogging, spray, satellites, firing sequences and other parameters. For other printing techniques other reasons apply. Even though printing parameters can be optimized to minimize the effect up to a certain degree in the long run more or less artificial deposition will take place.

As a consequence of those islands of very different sizes electrical devices, in particular, OLEDs, built on top of that can become very unreliable. In the case of OLEDS, this is on one hand, because in general particles are critical for thin OLEDs, due to shading effects during deposition of the organic material, thereby thinner layers of organic material or metal result, or even by directly forming a short to the cathode. On the other hand migration of material originating from the satellite deposition to the cathode during lifetime limits reliability. Once that happens, field strengths dramatically increase around those spots leading to increased current, which itself leads to higher temperature and a reduced resistivity of the organic material which in turn leads to a further increase of current. The total effect is a dramatically reduced lifetime of the organic material at this position and/or the formation of an electrical shortcut which renders the device dead.

The fabrication apparatus and method use an approach to assure deposition of layer material, in particular, metal, only in areas where it is intended to be or where it is uncritical if layer material is deposited by mistake, by introducing a protection film before printing the layer material. This film can cover the active area so layer material printed in this area by mistake sits on top of this film. Before the metal gets sintered the film will be removed, taking the potentially present unwanted metal with it and leaving a clean surface for, for example, OLED deposition.

The protective film, i.e. the protective material, is preferentially adapted to be removable completely, without removing the printed layer material as well. Just the unwanted layer material on top of the protective film should be removed with removing the protective film. The combination of these two requirements, i.e. i) remove the protective material completely and ii) not remove the printed layer material, is complicated to fulfil since on the one hand the printed layer material has to be heated to become dry and resistant to the removal process for the protection, on the other hand the heat treatment has the same effect on the protection material as well. Thus, by heating the tendency increases that a removal will not be possible. That means on the one hand, heating the layer material to increase its adhesion to the substrate also increases adhesion of the protection and thus either you tend to remove both, protection and the layer material, i.e. no drying, or you tend to remove none, i.e. with drying. The fabrication apparatus and method provide a solution, which solves both requirements, by using protective material with the above described properties, in particular, by using wax as protective material, and by applying the above mentioned fabrication steps.

Although in the above described embodiments the fabrication apparatus is adapted to fabricate an OLED, the fabrication apparatus can also be adapted to just fabricate a patterned layer on a substrate, in particular, a layer structure comprising a patterned first layer and a patterned second layer on a substrate. In particular, the fabrication apparatus can be adapted to just fabricate the layer structure indicated in FIG. 6. The fabricated layer structure can then be used as a basis for producing an OLED or another electrical device.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Processing steps like the application of the protective material and of the layer material, the ablation, the stripping of the protective material, et cetera performed by using one or several units or devices can be performed by any other number of units or devices. The control of the fabrication apparatus in accordance with the fabrication method can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a fabrication apparatus for fabricating a patterned layer on a substrate. Protective material is applied in second regions on the substrate and liquid layer material is then printed in first regions being different to the second regions on the substrate. The layer material is dried by heating the layer material to a drying temperature being smaller than a melting temperature of the protective material, before removing the protective material from the substrate by using a removing temperature being larger than the melting temperature of the protective material. A patterned layer can therefore be produced, without using, for example, a costly photolithography process, and because of the use of the protective material the layer material is present in the desired first regions only and not in the second regions. This improves the quality of the patterned layer, which may be used for producing an OLED.

The invention claimed is:

1. A fabrication method for fabricating a patterned layer on a substrate that is coated with a conductive layer, wherein the substrate comprises first regions, in which layer material forming the layer is to be applied, and second regions, in which the layer material is not to be applied, the fabrication method comprising:
   applying protective material in the second regions on the substrate,
   printing liquid layer material in the first regions on the substrate,
   drying the layer material by heating the layer material to a drying temperature being smaller than a melting temperature of the protective material ,
   ablating the conductive layer through at least one of the protective material and the applied layer material for generating a patterned conductive layer, and
   removing the protective material from the substrate by using a removing temperature being larger than the melting temperature of the protective material.

2. The fabrication method according to claim 1, wherein the protective material is applied by printing.

3. The fabrication method according to claim 1, wherein the protective material is wax.

4. The fabrication method according to claim 1, wherein the layer material is metal.

5. The fabrication method according to claim 1, wherein the protective material is removed using heated water.

6. The fabrication method according to claim 1, further comprising the step of sintering the layer material.

7. The fabrication method according to claim 1, further comprising the step of applying insulating material on the layer material after the protective material has been removed.

* * * * *